United States Patent
Wang et al.

(10) Patent No.: US 9,328,253 B2
(45) Date of Patent: May 3, 2016

(54) METHOD OF MAKING ELECTRICALLY CONDUCTIVE MICRO-WIRES

(71) Applicants: Yongcai Wang, Rochester, NY (US); Paul Matthew Hoderlein, Rochester, NY (US); John Andrew Lebens, Rush, NY (US); Hwei-Ling Yau, Rochester, NY (US); David Paul Trauernicht, Rochester, NY (US)

(72) Inventors: Yongcai Wang, Rochester, NY (US); Paul Matthew Hoderlein, Rochester, NY (US); John Andrew Lebens, Rush, NY (US); Hwei-Ling Yau, Rochester, NY (US); David Paul Trauernicht, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 493 days.

(21) Appl. No.: 13/757,913

(22) Filed: Feb. 4, 2013

(65) Prior Publication Data

US 2014/0216784 A1    Aug. 7, 2014

(51) Int. Cl.
*H05K 3/02* (2006.01)
*C09D 11/52* (2014.01)
*H05K 1/09* (2006.01)
*H05K 3/12* (2006.01)
*C09D 11/322* (2014.01)

(52) U.S. Cl.
CPC ............. *C09D 11/52* (2013.01); *C09D 11/322* (2013.01); *H05K 1/097* (2013.01); *H05K 3/1258* (2013.01); *H05K 2201/09036* (2013.01); *H05K 2201/09681* (2013.01); *H05K 2203/1361* (2013.01)

(58) Field of Classification Search
CPC ........... Y10T 29/49156; H05K 1/0296; H05K 3/3452; H05K 1/092
USPC .............................. 29/847; 174/250; 427/98.4
See application file for complete search history.

(56) References Cited

U.S. PATENT DOCUMENTS 5,621,449 A * 4/1997 Leenders et al. ............... 347/101
6,261,479 B1 * 7/2001 Yukinobu et al. .............. 252/514
6,400,027

(Continued)

FOREIGN PATENT DOCUMENTS

WO    2009/081386    7/2009
WO    2010/109465    9/2010

OTHER PUBLICATIONS

Jung et al, Morphology and conducting property of Ag/poly(pyrrole) composite nanoparticles: Effect of polymeric stabilizers, Synthetic Metals 161 (2011) pp. 1991-1995.

*Primary Examiner* — Paul D Kim
(74) *Attorney, Agent, or Firm* — Raymond L. Owens; Kevin E. Spaulding

(57) ABSTRACT

A method of making a conductive article includes providing a substrate having a surface with one or more micro-channels having a width of less than 12 μm. A composition is provided over the substrate and in the one or more micro-channels. The composition includes water and silver nanoparticles dispersed in the water and he weight percentage of silver in the composition is greater than 70% and the viscosity of the composition is in a range from 10 to 10,000 centipoise. The composition is removed from the surface of the substrate. The composition provided in the micro-channels is dried and converted to form one or more electrically conductive micro-wires.

17 Claims, 6 Drawing Sheets

(56) References Cited

U.S. PATENT DOCUMENTS

| | | |
|---|---|---|
| 6,400,027 B1 * | 6/2002 | Takahashi .................. 257/773 |
| 7,030,721 B2 * | 4/2006 | Yoshida et al. ............... 333/246 |
| 7,922,939 B2 * | 4/2011 | Lewis et al. .................. 252/514 |
| 7,931,941 B1 * | 4/2011 | Mastropietro et al. ...... 427/376.6 |
| 8,227,022 B2 * | 7/2012 | Magdassi et al. ............. 427/123 |
| 2004/0147618 A1 * | 7/2004 | Lee et al. ...................... 516/78 |
| 2005/0189520 A1 * | 9/2005 | Okada et al. .................. 252/500 |
| 2014/0216784 A1 * | 8/2014 | Wang et al. ................... 174/250 |
| 2014/0216797 A1 * | 8/2014 | Wang et al. ................... 174/257 |

* cited by examiner

METHOD OF MAKING ELECTRICALLY CONDUCTIVE MICRO-WIRES

CROSS REFERENCE TO RELATED APPLICATIONS

Reference is made to commonly assigned, co-pending U.S. patent application Ser. No. 13/757,891 filed Feb. 4, 2013, entitled "SILVER METAL NANOPARTICLE COMPOSITION" by Wang et al.; U.S. patent application Ser. No. 13/757,896 filed Feb. 4, 2013, entitled "METAL NANOPARTICLE COMPOSITION WITH WATER SOLUBLE POLYMER" by Wang et al.; U.S. patent application Ser. No. 13/757,899 filed Feb. 4, 2013, entitled "MAKING A CONDUCTIVE ARTICLE" by Wang et al.; U.S. patent application Ser. No. 13/757,901 filed Feb. 4, 2013, entitled "CONDUCTIVE ARTICLE HAVING SILVER NANOPARTICLES" by Wang et al.; and U.S. patent application Ser. No. 13/757,905 filed Feb. 4, 2013, entitled "CONDUCTIVE ARTICLE HAVING MICRO-CHANNELS" by Wang et al., the disclosures of which are incorporated herein.

Reference is made to commonly assigned U.S. patent application Ser. No. 13/746,346 filed Jan. 22, 2013 entitled "Method of Making Micro-Channel Structure for Micro-Wires" by Lebens, et al and to commonly assigned U.S. patent application Ser. No. 13/746,352 filed Jan. 22, 2013 entitled "Micro-Channel Structure for Micro-Wires" by Lebens, et al, the disclosures of which are incorporated herein.

FIELD OF THE INVENTION

The present invention relates to the composition and use of aqueous silver nanoparticle dispersions.

BACKGROUND OF THE INVENTION

Silver nanoparticle materials have become increasingly important in many technologies due to silver's unique chemical stability, excellent electrical conductivity, catalytic activity, and antimicrobial effect. Silver nanoparticle materials have found uses in microelectronics, optical, electronic and magnetic devices, sensors, especially in biosensors, and catalysts. For example in the area of printable electronics, silver nanoparticle dispersions have been widely regarded as the best candidates to form conductive traces by solution deposition processes. The solution processes permit a roll-to-roll process on flexible substrates at mild temperatures, which significantly reduces cost. The excellent conductivity of silver makes it possible to form very fine patterns (e.g., mesh or grid patterns) of conductive micro-wires that are essentially transparent to the unaided eye.

The proposed solution processes of the prior art include inkjet printing, micro-contact printing, flexographic printing, gravure printing, and direct ink-wiring through fine nozzles onto a substrate. With flexographic and gravure printing processes, the typical wet coverage (thickness) is on the order of a couple of microns, especially for narrow micro-wires. In order to accomplish greater than 0.3 µm dry coverage, the metal particle concentrations in the inks has to be greater than about 15% by volume, which is equivalent to a greater than 65% by weight.

For certain applications such as RFID tags, ink jet printing can be used to generate features having of low aspect ratios, e.g. less than 0.5 micron thick and greater than 50 microns wide. U.S. Pat. No. 8,227,022 has disclosed the generation of conductive patterns using aqueous based silver nanoparticle inks with multi-pass ink jet printing (5 passes or more) and sintering the printed patterns at temperatures of equal to greater than 150° C. The electrical resistivity generated at such conditions is greater than 0.2 ohms/square. The requirement of multi-pass and the resultant poor conductivity are perhaps due to the low weight percentage of silver nanoparticles in the inks and the particular stabilizers used which could lead to poor curing of silver nanoparticles during sintering.

U.S. Pat. No. 7,922,939 discloses a silver nanoparticle ink composition having a silver concentration of greater than 50% by weight and containing a first anionic polymer stabilizer having a molecular weight of at most 10,000, and a second anionic polymer stabilizer having a molecular weight of at least 25,000. The inks disclosed can be considered as a high viscous gel and have an elastic modulus value greater than the loss modulus value. Such inks are useful for deposition process such as direct ink writing. However the electrical conductivity generated by such ink compositions is limited after annealing at high temperatures.

U.S. Pat. No. 7,931,941 discloses a method of making silver nanoparticle dispersion using a carboxylic acid stabilizer having from 3 to 7 carbons. Such dispersions can be sintered into conductive films at lower sintering temperatures. However the dispersions are not water reducible and cannot be formulated into ink-jet inks.

Jung et al, Morphology and conducting property of Ag/poly(pyrrole) composite nanoparticles: Effect of polymeric stabilizers, Synthetic Metals 161 (2011) pgs. 1991-1995 discloses silver/polypyrrole composite nanoparticles prepared using poly(4-styrenesulfonic acid-co-maleic acid) sodium salt or poly(N-vinylpyrrolidone) as stabilizer. These formulations have low % Ag content, high ratios of stabilizer to silver and resistivities tens or hundreds of times higher than bulk silver.

WO2010/109465 discloses incorporating halide ions as a sintering agent into silver dispersions or receivers to improve conductivity.

WO2009/081386 discloses a method for producing very dilute solutions of silver nanoprisms that are not suitable for electronic devices.

There are various forms of non-aqueous based silver nanoparticle dispersions which have been described in the prior art. Some of them are commercially available. For environmental and safety reasons, it is highly desirable to have aqueous-based silver nanoparticle dispersions. For performance reasons, it is highly desirable that these aqueous silver nanoparticle dispersions are colloidally stable, can be prepared at high concentrations with low viscosities, are water reducible with excellent re-dissolution behaviors, and have excellent electrical conductivity after sintering.

SUMMARY OF THE INVENTION

In accordance with the present invention, a method of making a conductive article comprises:

providing a substrate having a surface with one or more micro-channels having a width of less than 12 µm;

providing a composition over the substrate and in the one or more micro-channels, wherein the composition includes water and silver nanoparticles dispersed in the water and the weight percentage of silver in the composition is greater than 70% and the viscosity of the composition is in a range from 10 to 10,000 centipoise;

removing the composition from the surface of the substrate; and drying and converting the composition provided in the one or more micro-channels to form one or more electrically conductive micro-wires.

The metal nanoparticle composition can be used to form highly conductive silver micro-wires. The resistivity of the inventive silver micro-wires can be within a factor of 5 of the bulk resistivity of pure silver. The micro-channels can be provided in a grid pattern to form transparent electrodes for use, e.g., in touch screens. The metal nanoparticle composition is easily provided into the micro-channels.

Further advantages of the present invention will become apparent from the details that are provided below.

DETAILED DESCRIPTION OF THE INVENTION

Figure 1:
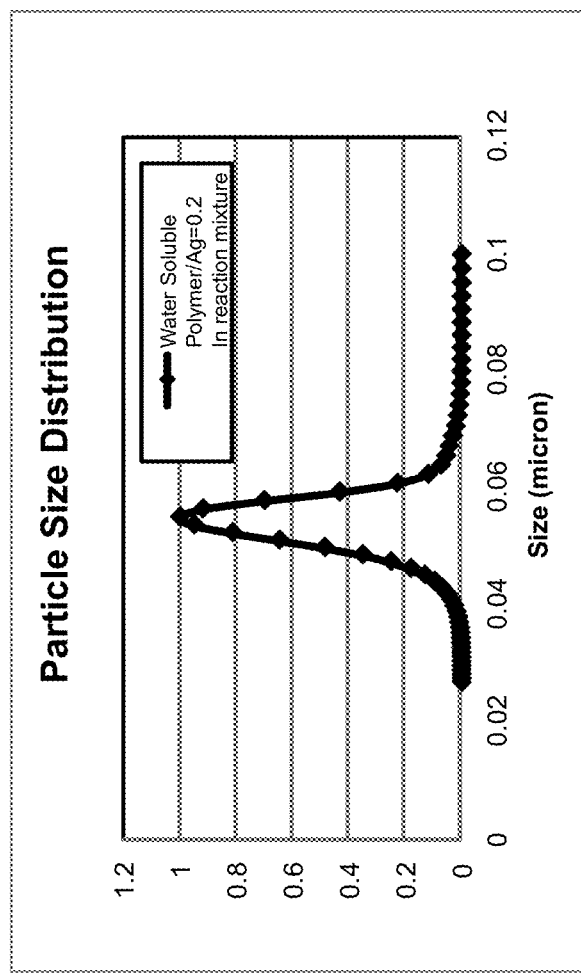
FIG. 1 is a plot of the silver nanoparticle size distribution for an embodiment of the present invention.

The aqueous silver nanoparticle dispersions of the present invention are prepared with a water-soluble polymer having both carboxylic acid and sulfonic acid groups. Such polymers can be prepared by various polymerization methods well known in the art. For example, they can be prepared by a free radical polymerization of a mixture of ethylenically unsaturated monomers which have a sulfonic acid side group and ethylenically unsaturated monomers which have a carboxylic acid group. The polymers can also be prepared by a post modification of a pre-formed copolymer which has one of the co-monomers with a carboxylic acid side group. The sulfonic acid group is introduced by sulfonation of the co-monomer which does not have the carboxylic acid side group. For example, poly(styrenesulfonic acid-co-maleic acid) can be made by first polymerization of a monomer mixture containing both styrene and maleic anhydride to form poly(styrene-co-maleic anhydride), and subsequent sulfonation and hydrolysis of the pre-formed polymer.

The water soluble polymer having both carboxylic acid and sulfonic acid groups can have various microstructures, such as, for example, random copolymer, block copolymer, and graft copolymer. The polymers can be linear, branched, and hyper-branched. The polymer can contain up to 10% of monomers which neither have neither sulfonic acid group nor carboxylic acid group.

Various ethylenically unsaturated monomers can be used to form the polymers for use to make the silver nanoparticle dispersions of the invention. Suitable ethylenically unsaturated monomers with sulfonic acid side group can include, for example, styrenesulfonic acid, 3-sulfopropyl acrylate, 3-sulfopropyl methacrylate, 2-sulfoethyl methacrylate, 3-sulfobutyl methacrylate, 2-acrylamido-2-methylpropane sulfonic acid. Suitable ethylenically unsaturated monomers containing carboxylic acid groups include acrylic monomers such as acrylic acid, methacrylic acid, ethacrylic acid, itaconic acid, maleic acid, fumaric acid, monoalkyl itaconate including monomethyl itaconate, monoethyl itaconate, and monobutyl itaconate, monoalkyl maleate including monomethyl maleate, monoethyl maleate, and monobutyl maleate, citraconic acid, and styrenecarboxylic acid, 2-carboxyethyl acrylate, 2-carboxyethyl acrylate oligomers.

Preferably the ratio of the sulfonic acid group to carboxylic acid group ranges from 0.05 to 5, preferably from 0.1 to 4, and most preferably from 0.5 to 2. The molecular weight of the polymers is typically more than 500 and less than 500,000, preferably less than 100,000, and most preferably less than 50,000. In certain embodiments, the carboxylic acid group is selected to stabilize the silver nanoparticle dispersion and the sulfonic acid group is selected to lower the polymer-to-silver weight ratio in the final dispersion. In a preferred embodiment of the present invention, the water-soluble polymer having both carboxylic acid and sulfonic acid groups is poly(styrenesulfonic acid-co-maleic acid).

In another preferred embodiment of the invention, the water-soluble polymer having both carboxylic acid and sulfonic acid groups is poly(styrenesulfonic acid-co-acrylic acid) having a molecular weight of less than 20,000, and preferably less than 10,000. It has been found unexpectedly that the silver nanoparticle dispersions with such polymers can be made at 90% by weight or above and have low viscosities. Further, the silver nanoparticle dispersions made with such polymers can have significantly lower sintering temperature for electrical conductivity than some of the other water-soluble polymers of the present invention.

The silver nanoparticle dispersions of the invention can be formed, for example, by forming an aqueous mixture of the water soluble polymer and a reducing agent, and adding a source of Ag+, and growing the silver nanoparticles. Suitable reducing agents are typical agents that are capable of reducing metals in aqueous systems, and include, for example, hydrazine, hydrazine hydrate, hydrogen, sodium borohydride, lithium borohydride, ascorbic acid, formic acid, aldehydes, and amines including a primary amine, a secondary amine, and a tertiary amine, and any combination thereof. Suitable Ag+ source can be any water soluble silver compound, for example, $AgNO_3$, $CH_3COOAg$, and $AgClO_4$. The reaction temperatures can vary from room temperature to 95° C. Preferably the reaction temperature is above 60° C.

The water soluble polymer having both sulfonic acid and carboxylic acid groups can be made into aqueous solutions with and without additional base. Various bases can be used, for example, ammonium hydroxide, lithium hydroxide, sodium hydroxide, potassium hydroxide, and the like.

Preferably the addition of the Ag+ source to the reaction mixture is by a continuous feeding process at a controlled rate. The stirring needs to be optimized to have good mix for a desired particle size and size distribution. The total weight of Ag+ in the reaction mixture is preferably above 5 wt %, and more preferably above 8 wt %. Highly concentrated and well dispersed silver nanoparticle dispersions can be prepared by purification of the reaction mixture with typical processes known in the art, for example, settling, centrifugation, dialysis, sonication, and evaporation. The weight percentage of silver nanoparticle in the final dispersion is preferably above 10%, and more preferably above 40%, and most preferably above 60%. Although an upper limit for silver has not been found, the weigh percentage of silver in the final dispersion does not usually exceed 90%. The viscosity of the dispersions at 60 wt % silver is preferably less than 100 centipoise, preferably less than 50 centipoises, and more preferably less than 20 centipoise. In some particular embodiments, dispersions having a weight percentage of silver in a range from 60 to 90% can advantageously have a viscosity of less than 100 centipoise, dispersions having a weight percentage of silver in a range from 60 to 80% can advantageously have a viscosity of less than 50 centipoise and dispersions having a weight percentage of silver in a range from 60 to 75% can advantageously have a viscosity of less than 20 centipoise. The surface tension of the dispersion is preferably above 50 dynes/cm, and more preferably above 60 dynes/cm.

Depending on the application process, the concentrated dispersion can be further formulated to include other addenda. For example, thermal ink jet printing normally requires the ink to have a viscosity of less than 10 centipoises, and to contain various types of humectants, and possibly surfactants.

In another embodiment of the present invention, a metal nanoparticle composition includes water with silver nanoparticles dispersed in the water. The weight percentage of silver in the metal nanoparticle composition is greater than 70% and the viscosity of the composition is in a range from 10 to 10,000 centipoise. In particular, the weight percentage of silver in the composition is advantageously in a range of 70 to 90% and the viscosity of the composition is in a range from 10 to 1000 centipoise. Alternatively, the weight percentage of silver is in a range of 70 to 80% and the viscosity of the composition is in a range from 10 to 100 centipoise. Further, the weight percentage of organic solids (see below) in such compositions is preferably in a range from 0.05 to 3% by weight.

The mean size of the silver nanoparticles in the dispersion of the present invention ranges from 5 nm to about 500 nm. The particle size can be tuned by the amount of water soluble polymer used, the reaction temperature, and the speed and method of agitation during reaction. In general, smaller particle size can be obtained by using a higher level of the water soluble polymer in the reaction, or a lower reaction temperature, or a slower stirring speed. The silver particle size can have a bimodal size distribution. Particle size and aggregation can affect the light absorption characteristics of the dispersions. In certain embodiments, the composition has a light absorption spectrum having a wavelength absorbance maximum between 400 and 500 nm.

In a preferred embodiment, a significant amount of the water soluble polymer and any other water soluble organics are removed during purification processes after the reaction. The level of water soluble polymer and other organic species in the final dispersion can be determined by drying the dispersion at an elevated temperature (e.g. 40 to 60° C.) under vacuum for more than 12 hours to remove water and low vapor-pressure organics. The dried solids are then analyzed by the thermal gravimetric analysis (TGA) to obtain the total amount of "organic solids" which includes both the water soluble polymer and other possible residual organic compounds in the dried dispersion. Typically, the water soluble polymer comprises most of the mass of the organic solids. The weight loss value at 700° C. is used to calculate the percentage of organic solids in the dried dispersion. The remaining solid matter is primarily silver. The "total solids" content of the dried dispersion is the sum of the organic solids and silver. In a preferred embodiment, the amount of organic solids for the dried silver nanoparticle dispersion of the invention ranges from 0.05% to 10% by weight relative to total solids. For applications such as conductive electrodes, the amount of organic solids is preferably from 0.05% to 4% by weight, preferably from 0.05% to 3% by weight, and most preferably from 0.05% to 2% by weight. The weight ratio of water soluble polymer to silver in the dispersions of the present invention is typically in a range from 0.0005 to 0.11. For applications such as conductive electrodes, this ratio is typically in a range from 0.0005 to 0.04, preferably 0.0005 to 0.03 and more preferably 0.0005 to 0.02. The lower limit of polymer to silver is to ensure that the silver nanoparticle dispersions of the invention do not form hard aggregates during storage and can be re-dispersed very easily after long standing even at high concentrations. In some useful embodiments, the weight ratio of the polymer to silver is in a range of 0.008 to 0.1, or in a range of 0.008 to 0.04, or in a range of 0.008 to 0.02. The upper limit is mostly determined by the types of applications. For the formation of conductive traces, it is preferred that the ratio is as low as possible for good electrical conductivity after sintering.

The silver nanoparticle dispersions of the invention preferably have a pH of from 3 to 10, more preferably from 4 to 9, and most preferably from 5 to 8.

The silver nanoparticle dispersions of the invention can be formulated into various inks and coating formulations for various applications. Such inks and coating formulations can include various addenda, such as lubricants, polymer binders including polymer latexes and dispersions, solvents and humectants, surfactants, colorants including pigments, rheology modifiers, thickeners, adhesion promoters, cross-linkers, biological additives, other metal particles of various sizes, for example, silver particles having size of greater than 500 nanometers, various oxide particles, or combinations thereof.

In a preferred embodiment of the invention, the silver nanoparticle dispersions of the invention are used to make conductive inks to form a conductive article of any type on a substrate. There is no limit on the type of deposition tools which can be used. For example, the silver nanoparticle dispersions of the invention can be made into ink jet inks which can be printed with any ink jet printing method such as thermal ink jet, piezo ink jet, MEMS jet, continuous ink jet, and the like. The concentrations of the silver nanoparticle dispersions of the invention for applications by ink jet are preferably in the range of from 10 to 40% by weight, more preferably in the range of from 15 to 35% by weight. For certain types of papers such Hammermill Tidal MP plain paper and Kodak Ultra Premium Ink Jet Photopaper, the printed silver nanoparticle dispersions of the invention become highly conductive just by drying at room temperature. This is also true for most commercial papers which have a surface coating containing $CaCl_2$.

There is no particular limit on the types of substrates which can be used for practice of the present invention, and include, for example, plastic substrates such as polyesters, polycarbonates, polyimide, epoxy, vinyl, glass and oxide substrates and modified glass and oxide substrates, metal and modified metal substrates, and paper and modified paper substrates, and the like.

The conductive inks including the silver nanoparticle dispersions of the invention can be used for screen printing, flexographic, gravure, photo-pattern, pad printing, and other processing techniques.

With a substrate such as polyimide or glass, the printed silver nanoparticles after drying at low temperature may not have adequate electrical conductivity. The dried silver nanoparticle composition can be converted into a more conductive form by applying heat to aid in sintering the silver. Preferably the sintering temperatures range from 100° C. to 400° C. and preferably from 150° C. to 300° C. With plastic substrates such as polyester and polycarbonate, such a high heat treatment temperature may significantly deform the substrate. Instead a light source provided by, for example, a PulseForge tool by Novacentrix can be used to expose the dried silver nanoparticles to improve its electrical conductivity.

Alternatively, the dried silver nanoparticles can be converted into a more highly conductive form by exposure to a halide. Treatment with solutions including an inorganic halide compound including, for example, sodium chloride, potassium chloride, hydrogen chloride, calcium chloride, magnesium chloride, sodium bromide, potassium bromide, hydrogen bromide, and the like. In a useful embodiment, the treatment is done by using a halide vapor source such as HCl vapor at room temperature.

Alternatively, the halide can be provided in or on a substrate. The substrates onto which the silver nanoparticle dispersions of the invention are deposited can have a coated layer including a halide compound such as calcium chloride.

In particularly useful embodiments, the substrate can include a halogen-containing polymer, for example as a coated layer. Unlike halide compounds that are ionic in nature, halogen-containing polymers include halogen atoms that are covalently bonded to the polymer. Examples of such polymers include both homopolymers and copolymers of vinyl chloride and vinylidene chloride. The copolymers can be formed by polymerizing vinyl chloride or vinylidene chloride with generally less than 50%, or in other embodiments less than 30% or less than 20%, by weight of other vinyl monomers, such as styrene, acrylonitrile, butadiene, methyl acrylate, ethyl acrylate, butyl acrylate, and the like. Preferably the coating thickness of such halogen-containing polymers on a substrate is greater than 0.5 µm, and more preferably greater than 1 µm. Under certain environmental stresses, some halogen-containing polymers can become slightly yellow. Thus, in some embodiments, the coating thickness of the halogen-containing polymer is advantageously less than 10 µm or even less than 5 µm.

In a preferred embodiment of the invention, the layer containing the halogen-containing polymer is formed by depositing an aqueous coating solution including a latex polymer comprising greater than 80% by weight of vinyl chloride or vinylidene chloride, and less than 10%, and more preferably less than 5% of a water soluble monomer including, for example, acrylic acid, methacrylic acid, itaconic acid, hydroxyethyl methacrylate, acrylamide, methacrylamide, and the like.

In another preferred embodiment of the invention, the layer including a halogen-containing polymer is formed by coating an aqueous solution including the latex and a water soluble polymer. The latex includes a halogen-containing polymer. The water soluble polymer is preferably selected from a group of nonionic water soluble polymers and copolymers, including, for example, poly(vinyl alcohol), poly(vinyl pyrrolidone), polyacrylamide, poly(ethylene oxide), hydroxylmethyl cellulose, hydroxyethyl cellulose, and the like. The layer can be cross-linked.

When exposing the silver nanoparticle composition to halide or halogen-containing polymers, additional heating is not always necessary to achieve high conductivity. However, in some instances it can be useful to further include a heating step after or during the exposure to halide or halogen-containing polymer. In these cases the heating is generally in a range of 40° C. to 120° C. When the substrate or substrate layer includes a halide or halogen-containing polymer, it is preferred that the silver nanoparticle dispersion is provided in direct contact with the halide or halogen-containing polymer.

Dispersions of the present invention can be coated to form effective conductive articles. In particular, after conversion by heat or halide or halogen-containing polymer, the silver metal can have bulk resistivity of less than 5 times that of pure silver. Preferably when making conductive articles, the dispersions of the present invention can form silver metal having a bulk resistivity that is less than 4 times, or even less than 3 times that of pure silver.

In a useful embodiment, the silver nanoparticle dispersions of the invention are patterned to form grids, meshes or other micro-wire patterns that have low apparent visibility, high transparency (for example, greater than 80% in the visible light transmittance) and low electrical resistivity (for example, less than 15 ohms/square). In certain embodiments, the micro-wires for forming transparent conductors are between 0.5 µm and 8 µm in width and greater than 0.2 µm in thickness. Transparent conductors have many uses. For example, they can be useful for EMI shielding and in photovoltaic devices. They are also useful for display industries to electrically switch light-emitting or light-transmitting properties of a display pixel, for example in liquid crystal or organic light-emitting diode displays, or to form touch screens in conjunction with displays. In touch screen applications, the optical transparency is limited by the width of conductive traces used to form the conductive electrodes, the density and uniformity of the conductive traces. It is highly desirable to limit the width of the conductive traces to less than 5 µm. Various printing and replication methods can potentially be used to form such thin conductive traces.

In the present invention, a particularly useful technique is to form such fine conductive traces in micro-channels embossed in a substrate. Embossing methods are generally known in the prior art and typically include coating a polymer layer onto a rigid substrate. A pattern of micro-channels is then embossed (impressed) onto the polymer layer by a master having a reverse pattern of ridges formed on its surface. The conductive ink is coated over the substrate and into the micro-channels; the excess conductive ink between micro-channels is removed. The conductive ink in the micro-channels is cured, for example by heating.

Figure 4:
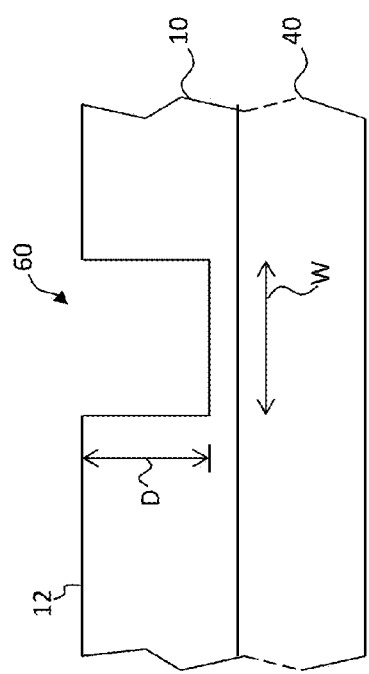
FIG. 4 is a cross sections of a micro-channel according to an embodiment of the present invention.
Figure 5:
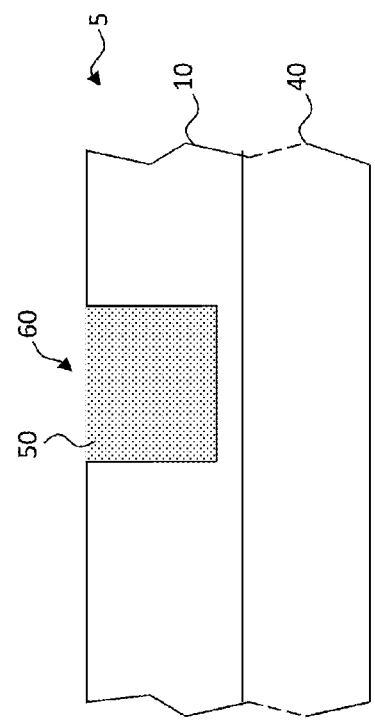
FIG. 5 is a cross section of a micro-wire in a micro-channel according to an embodiment of the present invention.
Figure 7:
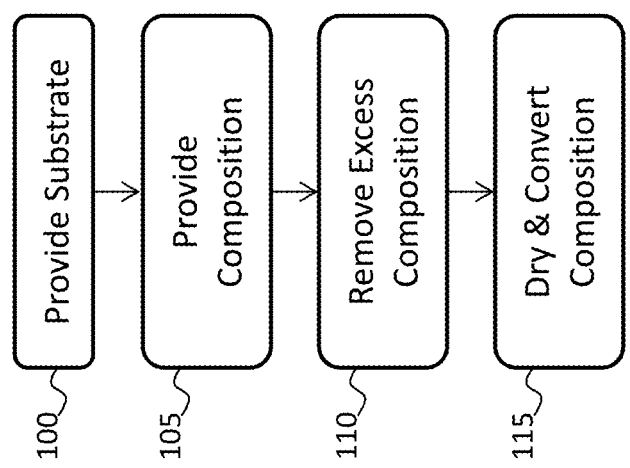
FIG. 7 is a flow diagram illustrating an embodiment of the present invention.

In an embodiment of the present invention referring to FIGS. 4, 5, and 7, a method of making a conductive article 5 includes providing (Step 100) a substrate 10 having a surface 12 with one or more micro-channels 60 having a width W of less than 12 µm. Suitable substrates 10 known in the art include curable polymer coatings formed on an underlying substrate 40 of glass, metal, or plastic. SU8 is suitable curable polymer that can be embossed to form a pattern of micro-channels. As shown, in FIGS. 4 and 5, substrate 10 is formed on a rigid underlying substrate 40, for example glass.

A composition 50 is provided (Step 105) over substrate 10 and in one or more micro-channels 60. The weight percentage of silver in composition 50 is greater than 70% and the viscosity of composition 50 is in a range from 10 to 10,000 cps. Composition 50 is provided over the surface 12 of substrate 10 and in micro-channels 60, for example by dip coating substrate 10 into a reservoir containing composition 50 or curtain coating composition 50 over substrate 10. Alternatively, a patterned deposition method is used, for example using an ink jet device. However, inkjet deposition typically provides composition 50 not only in micro-channels 60 but also over surface 12 of substrate 10, since inkjet deposition does not have sufficient accuracy to form lines as small as the embossed micro-channels 60.

Excess composition 50 is removed (Step 110) from surface 12 of substrate 10, for example by wiping surface 12 of substrate 10. Suitable wiping devices include flexible blades or a curved rotating absorbent surface such as a cylinder. Composition 50 provided in micro-channels 60 is then dried and converted (Step 115), either in sequential steps or in one common step, for example by heating, to form a micro-wire in each micro-channel 60, as illustrated in FIG. 5.

The present invention is useful for micro-channels 60 having a width less than 12 μm, 8 μm, or 5 μm and a depth D less than 10 μm. Applying methods of the present invention to micro-channels 60 of such dimensions is useful since prior-art patterned deposition methods, such as inkjet are currently limited to, for example, line widths of 20 μm or more.

Figure 6:
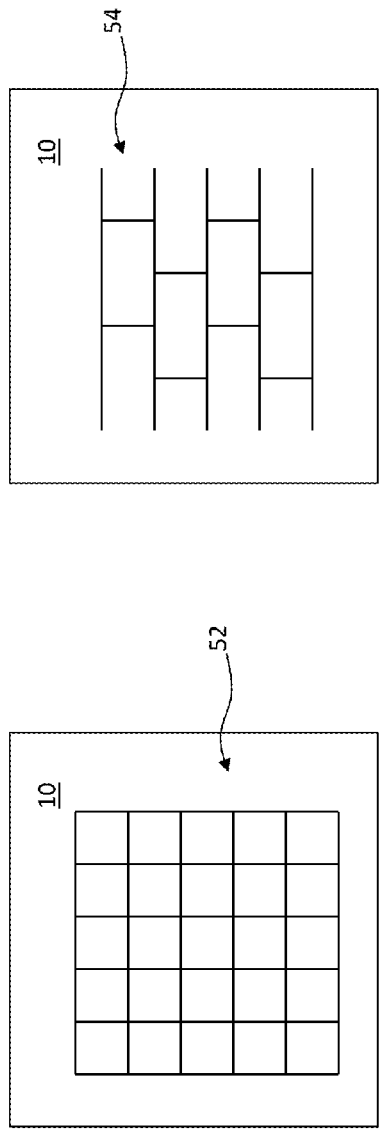
FIGS. 6A-6C illustrate micro-wire patterns on a substrate according to an embodiment of the present invention.

Furthermore, compositions 50 of the present invention are useful because they can be readily provided (e.g. by dip or curtain coating) into micro-channels 60 of such size, where higher viscosity compositions such as pastes are not readily coated with simple liquid coating processes, even with mechanical assistance such as might be provided with a conventional doctor blade. Moreover, mechanical coating methods for pastes can mar the surface 12. This can be especially true for micro-channel patterns that include intersecting micro-channels so that any mechanical coating device wipes across micro-channel 60 in one direction (for example along the length of micro-channel 60) and wipes across another, different micro-channel 60 in a different direction (for example across the width of micro-channel 60). Such a mechanically facilitated coating method for high-viscosity material is thus particularly problematic at micro-channel intersections where micro-channels 60 intersect at angles between and including 45 degrees and 90 degrees. Referring to FIGS. 6A, 6B, and 6C, micro-channel patterns of substrate 10 having such angles include rectangular grid patterns 52, offset rectangular patterns with alternately offset rows 54, and diamond-shaped patterns 56.

The present invention provides advantages over the prior art. Higher percentages of silver in cured inks provide improved conductivity and the reduced viscosity enable improved distribution of conductive ink into micro-channels. Prior-art pastes having conductive particles are not readily distributed into fine conductive traces and, in particular, into patterns of micro-channels in which micro-channels intersect with each other.

In another useful application of the present invention, the metal nanoparticle composition is deposited onto a substrate by first providing the metal nanoparticle composition onto upper areas of a relief pattern (e.g. a flexographic plate), followed by contacting the relief pattern to the substrate in order to transfer the metal nanoparticle composition from the relief pattern to the substrate.

EXAMPLES

Example 1

Preparation of the Silver Nanoparticles of the Invention

Ag-Dispersion-01

To a 1000 mL three neck flask was added, at 90 C and under $N_2$, 40 g of a 20% aqueous poly(4-styrenesulfonic acid-co-maleic acid), $Na^+$ salt (1:1 molar ratio of sulfonic acid to maleic acid, 20,000 MW) solution and 240 g of a 50% aqueous diethanolamine solution. 120 g of a 54.75% aqueous $AgNO_3$ solution was added drop wise over 150 minutes. The reaction mixture was stirred overnight before cooled down to room temperature. The solution was then sonicated for 20 minutes and permitted to settle. After the supernatant was decanted off, the concentrated product was dialyzed overnight and then centrifuged for 2 hours at 7000 rpm. The resultant slurry was then re-dispersed in water, sonicated, and filtered through a 1 μm filter. The prepared silver nanoparticle dispersion had a total solids content (organic solids plus silver) of about 49.6 wt %. The particle size and size distribution was analyzed by the Analytical Disc Centrifuge and had a particle size of 57 nm. The size distribution is shown in FIG. 1.

The resultant dried dispersion was analyzed by TGA at 700° C. in air for the amount of organic solids. Based on this analysis, the resultant Ag-dispersion-01 had 1.83% by weight of organic solids. The overall weight percentage of silver in the dispersion was about 48.7%.

Although the Ag-dispersion-01 was prepared using a weight ratio of poly(4-styrenesulfonic acid-co-maleic acid), $Na^+$ salt to Ag of 20% in the reaction, the final dispersion has a much lower content of the water soluble polymer, as evidenced by the thermal gravimetric analysis above.

Ag-Dispersion-02 Through Ag-Dispersion-06

Figure 2A:
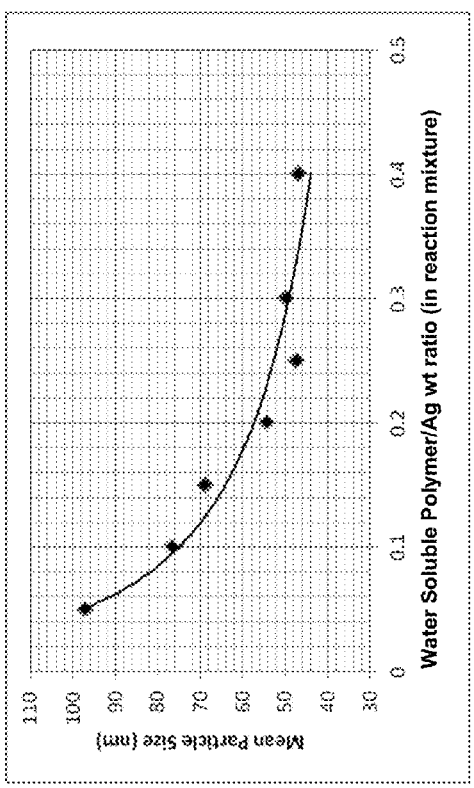
FIG. 2A is a plot of the mean silver nanoparticle size of dispersions of the present invention as a function of the water soluble polymer to silver weight ratio used in the reaction mixture.
Figure 2B:
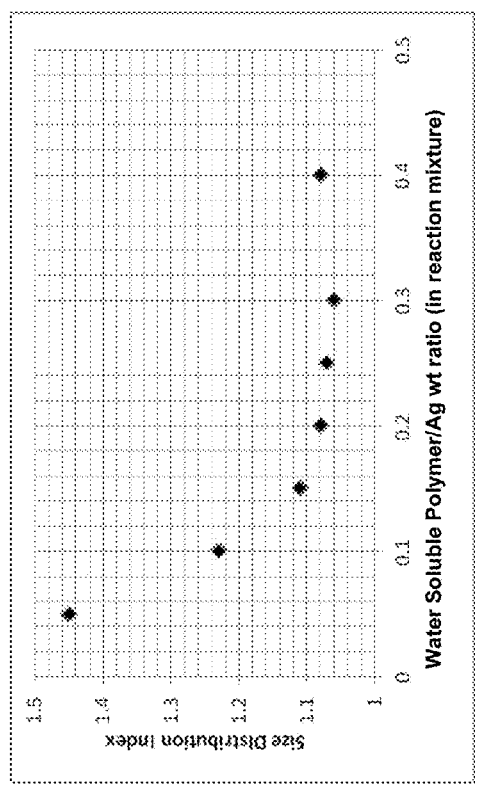
FIG. 2B is a plot of size distribution index as a function of the water soluble polymer to silver weight ratio used in the reaction mixture.

Ag-dispersion-02 through Ag-dispersion-06 were made in a similar manner to Ag-dispersion-01 except having a reaction weight ratio of poly(4-styrenesulfonic acid-co-maleic acid), $Na^+$ salt to Ag at 5%, 10%, 15%, 25%, 30%, and 40%. The resultant particle size and size distribution from the Analytical Disc centrifuge is shown in FIGS. 2A and 2B as a function of the water soluble polymer to Ag weight ratio used in the reaction. The geometric size distribution is calculated by first calculating the fractional mass distribution as a function of the particles size from the detector signal. Integrating the fractional mass for a given size range gives the total particle mass within that range. The apparent Stokes equivalent spherical diameter of the particles is calculated from the sedimentation time. It is the equivalent diameter of a hard sphere with the same density having the same sedimentation time as the measured particles. The resulting particle size distribution is a plot of mass fraction as a function of apparent Stokes equivalent spherical diameter.

Ag-Dipersion-07

Ag-dipersion-07 was made in a similar manner to Ag-dispersion-01 except using poly(4-styrenesulfonic acid-co-maleic acid), $Na^+$ salt (3:1 molar ratio, 20,000 MW) solution as the water soluble polymer at 20% concentration relative to silver in the reaction mixture. The resultant dispersion had a total solids content of about 27.8% by weight, and mean particle size of about 60 nm. The resultant dried dispersion was analyzed by TGA at 700° C. in air for the amount of organic solids. Based on this analysis, Ag-dispersion-07 had 1.47% by weight of the organic solids. Thus, the overall weight percentage of silver in the dispersion was about 27.4%.

Ag-Dispersion-08

A poly(4-styrenesulfonic acid-co-acrylic acid) (1/1 by weight) polymer was made in a 67/33 water/IPA mixture by free radical polymerization at 70° C. Thiol glycerol was used as the chain transfer agent. After IPA was removed by evaporation, the solution was extracted with MEK to remove the residual monomers. The MEK layer was separated and the polymer solution was concentrated. The result weight percentage of polymer in the solution was about 45%. The polymer had a molecular weight of about 5900.

The polymer prepared was neutralized with ammonium hydroxide to a pH value of from 6 to 7. The resultant solution was used to prepare Ag-dispersion-08 in a similar manner to Ag-dispersion-01. The silver nanoparticle dispersion prepared had a mean particle size of about 46 nm and a total solids content of about 90% by weight. Even at this high percentage of total solids, the solution did not gel and was still quite fluid and easy to handle. The resultant dried dispersion was analyzed by TGA at 700° C. in air for the amount of organic solids. Based on this analysis, Ag-dispersion-08 had 1.3% by weight of the organic solids. Thus, the overall weight percentage of silver in the dispersion was about 89%.

An ink was made at 60 wt % silver nanoparticles using the above silver dispersion by mixing it with 0.7% of a latex. The ink was drawn with a glass capillary tip to form liquid traces which are greater than 15 cm and less than 1.5 mm on a transparent polyester receiver surface having a poly(vinylidene chloride) subbing layer. The trace was dried at 120° C. The electrical resistances were measured at 15 cm length and found to have a value of about 85 ohms after 10 min drying, 50 ohms after 20 min, 23 ohms after 60 min drying.

Example 2

Figure 3:
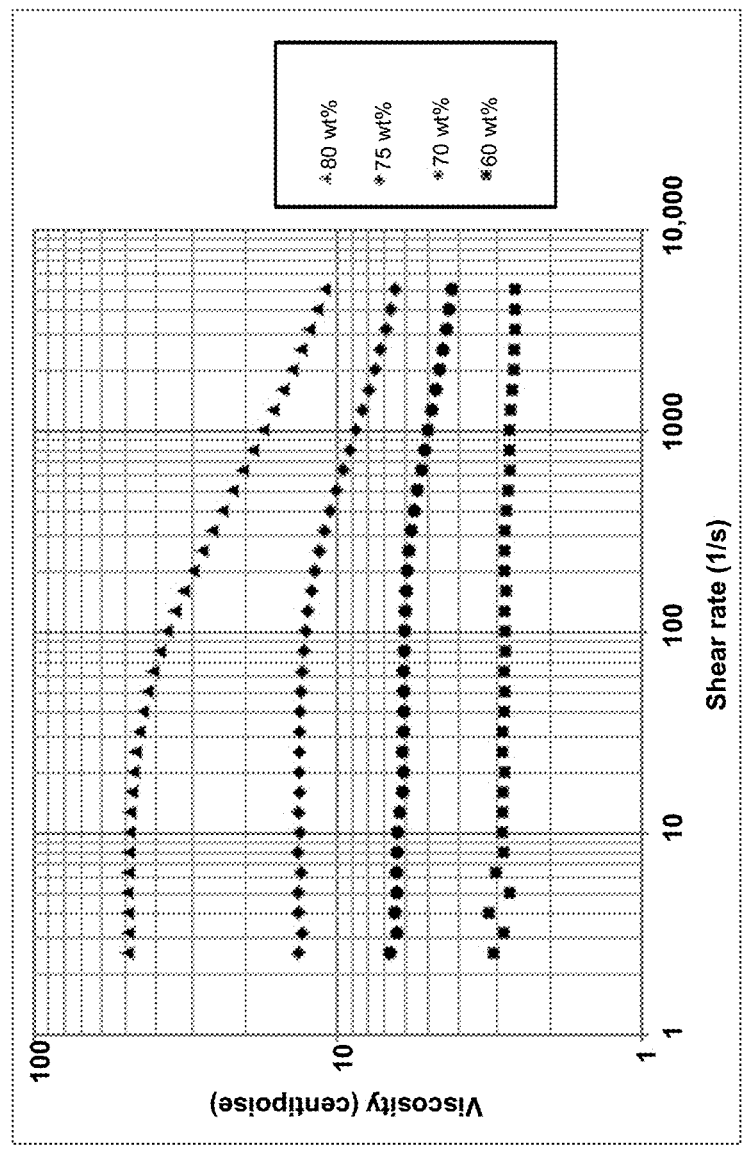
FIG. 3 is a plot of dispersion viscosity as a function of shear rate for various dispersions of the present invention.

Rheological Properties and Surface Tension of the Silver Nanoparticle Dispersions of the Invention Ag-dispersion-09 was prepared in a similar manner to Ag-dispersion-01 except using a reaction weight ratio of poly(4-styrenesulfonic acid-co-maleic acid), Na$^+$ salt to Ag at 12%. The resultant dispersion had a total solids of about 83.5% by weight and a mean particle size of about 79.6 nm. The resultant dried dispersion was analyzed by TGA at 700° C. in air for the amount of organic solids. Based on this analysis, Ag-dispersion-09 had 0.98% by weight of the organic solids. Thus, the overall weight percentage of silver in the dispersion was about 82.7%. The rheology of the dispersion was measured at various percent solids and the results are plotted as a function of shear rate in FIG. 3. The figure clearly demonstrates the advantages of the silver nanoparticle dispersions of the invention. Even at high percentages of total solids, the viscosity of the dispersions are still well-below 100 cps. The surface tension of the dispersion was also measured at various percent of total solids (60 to 80 wt %) and was found to be in the range of from 60 to 70.2 dynes/cm.

Example 3

Re-Dissolution Properties of the Silver Nanoparticle Dispersions of the Invention One of the critical parameters for printing by the ink jet method is that the inks after drying should have excellent re-dissolution properties to prevent ink jet nozzle from clogging. The Ag-dispersion-09 prepared above was tested for this performance. The dispersion was dried under vacuum at 50° C. overnight. The dried solids were re-dispersed in water with slight agitation. It was found that the dried silver nanoparticles can be readily re-dispersed in water.

Example 4

Electrical Resistivity of the Silver Nanoparticle Dispersions of the Invention by Ink Jet Printing on The silver nanoparticle dispersion of the invention having a mean particle size of about 58 nm was printed by the thermal ink jet method using Kodak ink jet head on the Kodak Ultra Premium Ink Jet Photopaper at two different total solids levels: 17.5 wt % and 30.9 wt %. The printing was done single-pass respectively at 2400 dots, 1200 dots, and 600 dots per inch (DPI). The printed image was about 15 cm long and 0.2136 cm wide. The samples were dried at room temperature overnight after printing. The electrical resistance of each sample was measured. The results were converted to and presented as ohms/sq (Table 1). The thickness of the printed images was calculated by mass balance. The calculated result was also confirmed by SEM cross-section measurement. The bulk resistivity of the resulted image was then calculated and compared with pure Ag (see Table 1).

TABLE 1

|  | Ink Total Solids | | | | | |
| --- | --- | --- | --- | --- | --- | --- |
|  | 30.9% | 30.9% | 30.9% | 17.5% | 17.5% | 17.5% |
| DPI | 2400 | 1200 | 600 | 2400 | 1200 | 600 |
| Thickness (micron) | 0.72 | 0.36 | 0.18 | 0.32 | 0.16 | 0.08 |
| ohms/sq | 0.070 | 0.120 | 0.294 | 0.164 | 0.330 | 0.868 |
| Bulk resistivity ($\mu\Omega \cdot cm$) | 5.06 | 4.35 | 5.32 | 5.25 | 5.29 | 6.95 |
| Ratio to bulk Ag resistivity | 3.2 | 2.7 | 3.3 | 3.3 | 3.3 | 4.4 |

The above Ag dispersion was also printed a single pass on Hammer Mill Tidal MP paper, and on a polyester substrate which was coated with a layer comprising poly(vinyl alcohol), CaCl$_2$, and 2,3-dihydroxy-1,4-dioxane cross-linker. The results are tabulated in Table 2.

TABLE 2

| | | Ink Total Solids | | | |
| --- | --- | --- | --- | --- | --- |
| | | 30.90% | 30.90% | 17.50% | 17.50% |
| | | Drying Condition | | | |
| | | Overnight room temp | 115° C./ 10 min | Overnight room temp | 115° C./ 10 min |
| Substrate | DPI | Ω/sq | Ω/sq | Ω/sq | Ω/sq |
| Polyester | 1200 | 2.17 | 0.47 | Not conductive | Not conductive |
| | | 2.03 | 0.44 | Not conductive | Not conductive |
| | 2400 | 0.46 | 0.13 | 4.36 | 2.23 |
| | | 0.43 | 0.11 | 3.40 | 1.81 |
| | 4800 | 0.19 | 0.06 | 0.50 | 0.28 |
| | | 0.23 | 0.08 | 0.48 | 0.24 |
| Hammer Mill | 1200 | 6.47 | 2.49 | 8.24 | 5.04 |
| | | 2.77 | 1.48 | 3.81 | 2.64 |

TABLE 2-continued

| Substrate | DPI | Ink Total Solids | | | |
|---|---|---|---|---|---|
| | | 30.90% | 30.90% | 17.50% | 17.50% |
| | | Drying Condition | | | |
| | | Overnight room temp Ω/sq | 115° C./ 10 min Ω/sq | Overnight room temp Ω/sq | 115° C./ 10 min Ω/sq |
| | 2400 | 0.29 | 0.24 | 0.99 | 0.80 |
| | | 0.25 | 0.20 | 0.70 | 0.57 |
| | 4800 | 0.11 | 0.09 | 0.44 | 0.37 |
| | | 0.10 | 0.08 | 0.29 | 0.29 |

The above Ag dispersion at 30.9 wt % total solids was also printed single-pass at 2400 DPI on various low cost papers such as New Page Book DIJ (digital ink jet), New Page Mill Trial No. 110 made by New Page, and IPDSL (international paper data speed laser) Inkjet w/image lok. The printed ink was dried overnight at room temperature and then at 110° C. for 10 minutes. The results are tabulated in Table 3.

TABLE 3

| | Overnight RT (Ω/sq) | 115° C./10 min (Ω/sq) |
|---|---|---|
| New Page Book DIJ | 1.12 | 1 |
| New Page Mill Trail No110 | 0.31 | 0.26 |
| IPDSL Inkjet w/image lok | 0.52 | 0.43 |

The above results clearly demonstrate that the silver nanoparticle dispersions of the invention can be printed by the thermal ink jet printing on various substrates to have excellent electrical conductivity with just single-pass printing. The excellent ink printing properties are primarily due to the lower viscosity of the inks at high percentage solids since it is well known in the art that thermal ink jet can only reliably printing inks with an ink viscosity of less than 3 to 5 cps and having excellent re-dispersion behaviors.

Example 5

Electrical Resistivity of the Silver Nanoparticle Dispersions of the Invention on Substrates with Various Ink Receiving Layers A transparent polyester film having a thickness of about 100 microns was coated with ink receiving layers having compositions shown in Table 4. A silver nanoparticle dispersion as prepared in a similar manner to Ag-dispersion-01 except the reaction temperature was at 70° C. The silver nanoparticle dispersion prepared had a bimodal size distribution with the peak sizes being located at 63 and 139 nm. An ink was made from the dispersion and had a total solids of about 40 wt %. The ink was drawn with a glass capillary tip on the receiver surface to form liquid traces which are greater than 15 cm long and less than 1.5 mm wide. Two separate traces were drawn on each receiver surface. The ink was dried at 120° C. for 10 min. The electrical resistance was measured at 15 cm distance. The results are reported as ohms per 15 cm length and are shown in Table 5.

TABLE 4

| Receiver Example | Composition | dry coating weight in mg/ft$^2$ and in [mg/m$^2$] |
|---|---|---|
| A | AQ55 (Eastman Chemical) | 100 [9.3] |
| B | Poly(methyl acrylate-co-acetoacetoxyethyl methacrylate-co-2-Acrylamido-2-methyl-1-propanesulfonic acid) (90/7/3) | 100 [9.3] |
| C | Sancure 898 (Lubrizol) | 100 [9.3] |
| D | Neorez R600 (DSM) | 100 [9.3] |
| E | GH23 (Nippon Gohsei)/Dihydroxydioxane (DHD) | 60/0.6 [5.6/0.56] |
| F | poly(vinylidiene chloride-acrylonitrile-co-acrylic acid) (VC-1) | 100 [9.3] |
| G | Poly(methyl acrylate-co-vinylidiene chloride-co-itaconic acid) (VC-2) | 100 [9.3] |
| H | GH23/VC-1/DHD | 40/60/0.4 [3.7/5.6/0.037] |
| I | GH23/VC-1/DHD | 80/120/0.8 [7.4/11/0.074] |
| J | GH23/VC-1/DHD | 30/70/0.3 [2.8/6.5/0.028] |
| K | GH23/VC-1/DHD | 60/140/0.6 [5.6/13/0.056] |
| L | GH23/VC-2/DHD | 40/60/0.4 [3.7/5.6/0.037] |
| M | GH23/VC-2/DHD | 80/120/0.8 [7.4/11/0.074] |
| N | GH23/VC-2/DHD | 30/70/0.3 [2.8/6.5/0.028] |
| O | GH23/VC-2/DHD | 60/140/0.6 [5.6/13/0.056] |

TABLE 5

| Receiver Example | Trace 1 (ohms) | Trace 2 (ohms) |
|---|---|---|
| A | NC | NC |
| B | NC | NC |
| C | NC | NC |
| D | NC | NC |
| E | NC | NC |
| F | 23.2 | 22 |
| G | 76 | 75 |
| H | 23 | 20 |
| I | 7.5 | 7.2 |
| J | 22 | 27 |
| K | 7.8 | 7.3 |
| L | 23.8 | 26.9 |
| M | 9.4 | 8.8 |
| N | 24.8 | 30.3 |
| O | 7.2 | 6.8 |

Receiver examples A through E were formed with organic polymers well-known in the art, such polyester, acrylic polymer, polyurethanes, and poly(vinyl alcohol). These receivers do not include halogen-containing polymers. Table 5 clearly demonstrates that the dried silver nanoparticle ink is not conductive (labeled "NC") when processed under the above conditions. In contrast, receivers F through O were formed with polymers which have chlorinated alkyl groups. The dried silver nanoparticle inks of the invention on these receivers have excellent conductivity.

An ink was made of the silver nanoparticle dispersion as prepared in a similar manner as Ag-dispersion-01 and had total solids of about 27.5%. The ink was printed by the thermal ink jet method using Kodak ink jet head on the receivers H through O. The printing was done single-pass at 2400 DPI. The ink was dried at 115° C. for 20 min. The electrical resistance (ohms) was measured at 15 cm length. The height and width of dried traces were measured by a contact profilometer. The surface and bulk resistivities were then calculated based on these measurements. The results are shown in Table 6.

TABLE 6

| Receiver | Ohms 15 cm | Width (cm) | Height (μm) | Surface resistivity (Ω/sq) | Bulk resistivitiy (μΩ·cm) | Ratio to pure Ag bulk resistivity |
|---|---|---|---|---|---|---|
| H | 23.8 | 0.057 | 0.576 | 0.091 | 5.21 | 3.28 |
| I | 19.3 | 0.051 | 0.494 | 0.066 | 3.25 | 2.04 |
| J | 20.2 | 0.062 | 0.433 | 0.084 | 3.63 | 2.28 |
| K | 18.4 | 0.052 | 0.517 | 0.064 | 3.29 | 2.07 |
| L | 33.1 | 0.046 | 0.730 | 0.101 | 7.39 | 4.65 |
| M | 22.8 | 0.045 | 0.596 | 0.068 | 4.05 | 2.55 |
| N | 35.9 | 0.047 | 0.604 | 0.113 | 6.8 | 4.28 |
| O | 18.8 | 0.046 | 0.678 | 0.058 | 3.91 | 2.46 |

Table 6 clearly demonstrates that excellent conductivity can be achieved using the halogen-containing polymer receiver compositions at significantly lower curing temperature.

Other comparative receivers were made by treating polyester surface having a primer layer as disclosed in the WO 2010/109465 with poly(diallyldimethylammonium chloride), poly(ethyleneimine), and cetyltrimethylammonium bromide, respectively. The above silver nanoparticle ink was then applied to these receivers and dried at 120° C. for 10 min. The dried silver traces were found not conductive.

Example 6

Electrical Resistivity of the Silver Nanoparticle of the Invention Wherein the Converting was Done by Exposing the Dried Metal Nanoparticle Composition to a Halide Source A silver nanoparticle ink was made by combining 15 grams of a silver nanoparticle dispersion prepared in accordance with the present invention having total solids of about 60.3% and a particle size of about 67 nm, 5.25 grams of a 2% hydroxyethyl cellulose thickener solution, 0.55 grams of 1-butanol, and 1 gram of 1-propanol. The ink was drawn with an off-shelf glass pipet on a polyester receiver surface to form liquid traces. The liquid traces were dried at 120° C. for 10 min.

A series of treatment solutions were prepared mixed solvent to have an HCl concentration at 0.01, 0.005, 0.0025, 0.00125, and 0.000675N in 80/20 water/isopropanol mixed solvent. Each treatment solution was transferred to a spray bottle. The dried silver ink strips were then sprayed twice with the treatment solution and blotted the backside of strips on a paper towel. The silver ink strips were then dried at 120° C. for 2 min. The electrical resistance was then measured at 15 cm length. The results are shown in Table 7

TABLE 7

| HCl (N) | Resistivity (ohms) |
|---|---|
| 0.01 | 35 |
| 0.005 | 24 |
| 0.0025 | 74 |
| 0.00125 | 239 |
| 0.000675 | Not conductive |

In the next experiment, the silver ink traces were prepared as above except that the dried silver ink traces were treated by HCl vapor. The HCl vapor was formed by filling a glass desiccator with about 200 mL of concentrated HCl. A ceramic plate was placed above the HCl solution. The samples were placed on the top of the ceramic plate during treatment. The electrical resistance was measured at 15 cm length. The results are shown in Table 8.

TABLE 8

| Time in HCl vapor (sec) | Resistivity (ohms) |
|---|---|
| 30 | 13.5 |
| 120 | 12 |
| 180 | 10 |
| 500 | 10 |
| 600 | 11.5 |

Comparative Examples

Comparative-Ag-01

Comparative-Ag-01 was prepared in a similar manner as Ag-dispersion-01 except that poly(4-styrenesulfonic acid), sodium salt having a molecular weight of 70,000 was used as the water soluble polymer at a 20% weight ratio to silver in the reaction mixture. It was observed that Ag precipitated completely out of the reaction solution to form films on the side of glassware.

Comparative-Ag-02

Comparative-Ag-02 was prepared in a similar manner as Ag-dispersion-01 except that poly(vinyl pyrrolidone) (PVP-15) was used as the water soluble polymer at a 20% weight ratio to silver in the reaction mixture. It was observed that Ag precipitated completely out of the reaction solution.

Comparative-Ag-03

Comparative-Ag-03 was prepared in a similar manner as Ag-dispersion-01 except that poly(acrylic acid) (1800 MW) was used as the water soluble polymer at a 20% weight ratio to silver in the reaction mixture. It was found that the resultant dispersion was quickly settled out of the solution.

Comparative-Ag-04

Comparative-Ag-04 was made in a similar manner as Ag-dispersion-01 except that poly(styrene-maleic anhydride) (SMA17352 from Sartmer, neutralized with KOH) was used as the water soluble polymer at a 20% ratio to silver in the reaction mixture. The resulted dispersion had total solids of about 38% by weight, a particle size of about 35 nm, and organic solids of about 4.34% by weight as determined by TGA at 700° C. The dispersion was drawn with a glass capillary tip on a PET receiver surface having a gelatin subbing layer to form liquid traces which are greater than 15 cm and less than 1.5 mm. The trace was dried at 120° C. and then treated with HCl vapor for about 2 min. The trace was found not-conductive.

Comparative-Ag-05

Comparative-Ag-05 was made in a similar manner as Ag-dispersion-01 except that poly(benzyl methacrylate-comethacrylic acid) (50/50, MW 8500, neutralized with KOH) was used as the water soluble polymer at a 20% weight ratio to silver in the reaction mixture. The resulted dispersion had total solids of about 43.6% by weight, a particle size of about 43 nm, and a total organic solids of about 6.46% by weight as determined by TGA at 700° C. The dispersion was drawn with a glass capillary tip on a PET receiver surface having a gelatin subbing layer to form liquid traces which are greater than 15 cm and less than 1.5 mm. The trace was dried at 120° C. and then treated with HCl vapor for about 2 min. The trace was found not-conductive.

The invention has been described in detail with particular reference to certain preferred embodiments thereof, but it will be understood that variations and modifications can be effected within the spirit and scope of the invention.

PARTS LIST

D depth
W width
5 conductive article
10 curable/cured layer
12 surface
40 underlying substrate
50 composition
52 micro-channel grid pattern
54 micro-channel offset grid pattern
56 micro-channel diamond pattern
60 micro-channel
100 provide substrate step
105 provide composition step
110 remove excess composition step
115 dry and convert composition step

The invention claimed is:

1. A method of making electrically conductive micro-wires comprising:
   providing a substrate having a surface with one or more micro-channels having a width of less than 12 μm but not less than 0.5 μm;
   providing a composition directly over the substrate and in the one or more micro-channels, wherein the composition includes water and silver nanoparticles dispersed in the water and a weight percentage of silver in the composition is greater than 70% and a viscosity of the composition is in a range from 10 to 10,000 centipoise;
   removing the composition from the surface of the substrate, but leaving at least a portion of the composition in the micro-channels; and
   drying and converting the composition provided in the one or more micro-channels to form one or more electrically conductive micro-wires.

2. The method of claim 1 wherein providing the composition over the substrate and in the one or more micro-channels further includes dip coating the substrate in a reservoir containing the composition.

3. The method of claim 1 wherein providing the composition over the substrate and in the one or more micro-channels further includes curtain coating the substrate with the composition.

4. The method of claim 1 wherein removing the composition from the surface of the substrate further includes wiping the surface of the substrate.

5. The method of claim 4 wherein the surface of the substrate is wiped with a flexible blade.

6. The method of claim 4 wherein the surface of the substrate is wiped with a curved rotating surface.

7. The method of claim 1 wherein the one or more micro-channels have a width less than 8 μm.

8. The method of claim 1 wherein the one or more micro-channels have a width less than 5 μm.

9. The method of claim 1 wherein the one or more micro-channels have a depth less than 10 μm.

10. The method of claim 1 wherein two or more of the micro-channels intersect to form a micro-channel intersection.

11. The method of claim 10 wherein the intersecting micro-channels intersect at an angle greater than or equal to 45 degrees and less than or equal to 90 degrees.

12. The method of claim 11 wherein the intersecting micro-channels form a grid.

13. The method of claim 12 wherein the grid is a rectangular grid.

14. The method of claim 12 wherein the grid is a diamond grid.

15. The method of claim 12 wherein the grid forms rows that are alternately offset.

16. The method of claim 1 wherein the weight percentage of silver is in a range of 70 to 90% and the viscosity of the composition is in a range from 10 to 1000 centipoise.

17. The method of claim 16 wherein the composition further includes organic solids having a weight percentage in a range from 0.05 to 3%.

* * * * *